(12) United States Patent
Shank et al.

(10) Patent No.: US 11,158,535 B2
(45) Date of Patent: Oct. 26, 2021

(54) MULTI-DEPTH REGIONS OF HIGH RESISTIVITY IN A SEMICONDUCTOR SUBSTRATE

(71) Applicant: GLOBALFOUNDRIES U.S. Inc., Santa Clara, CA (US)

(72) Inventors: Steven M. Shank, Jericho, VT (US); Anthony K. Stamper, Williston, VT (US); Siva P. Adusumilli, South Burlington, VT (US); Ian McCallum-Cook, Burlington, VT (US); Michel J. Abou-Khalil, Essex Junction, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 115 days.

(21) Appl. No.: 16/598,064

(22) Filed: Oct. 10, 2019

(65) Prior Publication Data
US 2021/0111063 A1  Apr. 15, 2021

(51) Int. Cl.
*H01L 29/04* (2006.01)
*H01L 29/32* (2006.01)
(Continued)

(52) U.S. Cl.
CPC ...... *H01L 21/763* (2013.01); *H01L 21/26533* (2013.01); *H01L 21/324* (2013.01);
(Continued)

(58) Field of Classification Search
CPC ....... H01L 21/76224–76237; H01L 21/76243; H01L 21/76267; H01L 21/76283;
(Continued)

(56) References Cited

U.S. PATENT DOCUMENTS

| | | | |
|---|---|---|---|
| 5,723,896 A | | 3/1998 | Abraham et al. |
| 6,455,903 B1 * | | 9/2002 | Yu ..................... H01L 21/26506 257/391 |

(Continued)

FOREIGN PATENT DOCUMENTS

EP  1365447 A2 * 11/2003  ....... H01L 21/76243

OTHER PUBLICATIONS

Michel J. Abou-Khalil et al., "Semiconductor Structures Including Stacked Depleted and High Resistivity Regions", filed Aug. 28, 2019 as U.S. Appl. No. 16/553,737.

*Primary Examiner* — Yu Chen
(74) *Attorney, Agent, or Firm* — Thompson Hine LLP; Anthony Canale

(57) ABSTRACT

Semiconductor structures including electrical isolation and methods of forming a semiconductor structure including electrical isolation. Shallow trench isolation regions extend from a top surface of a semiconductor substrate into the semiconductor substrate. The semiconductor substrate contains single-crystal semiconductor material, and the shallow trench isolation regions are positioned to surround an active device region of the semiconductor substrate. A polycrystalline layer is formed in the semiconductor substrate. The polycrystalline layer has a first section beneath the active device region and a second section beneath the plurality of shallow trench isolation regions. The first section of the polycrystalline layer is located at a different depth relative to the top surface of the semiconductor substrate than the second section of the polycrystalline layer.

20 Claims, 4 Drawing Sheets

(51) Int. Cl.
*H01L 21/265* (2006.01)
*H01L 21/763* (2006.01)
*H01L 29/06* (2006.01)
*H01L 21/324* (2006.01)
*H01L 21/762* (2006.01)
*H01L 29/36* (2006.01)
*H01L 29/10* (2006.01)

(52) U.S. Cl.
CPC ........ *H01L 21/76237* (2013.01); *H01L 29/04* (2013.01); *H01L 29/0642* (2013.01); *H01L 29/1083* (2013.01); *H01L 29/32* (2013.01); *H01L 29/36* (2013.01)

(58) Field of Classification Search
CPC ............. H01L 21/76264; H01L 21/763; H01L 21/26533; H01L 21/324; H01L 21/0245; H01L 21/02513; H01L 21/02667–02691; H01L 29/04; H01L 29/0642; H01L 29/1083; H01L 29/32; H01L 29/36; H01L 21/26506; H01L 21/3221; H01L 29/0649
See application file for complete search history.

(56) References Cited

U.S. PATENT DOCUMENTS

| | | |
|---|---|---|
| 8,299,537 B2 | 10/2012 | Greco et al. |
| 8,324,031 B2 | 12/2012 | Tan et al. |
| 10,192,779 B1 | 1/2019 | Shank et al. |
| 2002/0115268 A1* | 8/2002 | Jang ................. H01L 21/76243 438/480 |
| 2004/0241955 A1* | 12/2004 | Doris ............... H01L 21/76237 438/423 |
| 2015/0187942 A1* | 7/2015 | Zhu .................... H01L 29/7371 257/347 |
| 2019/0295881 A1 | 9/2019 | Shank et al. |
| 2020/0176589 A1* | 6/2020 | Adusumilli ....... H01L 21/26586 |

\* cited by examiner

MULTI-DEPTH REGIONS OF HIGH RESISTIVITY IN A SEMICONDUCTOR SUBSTRATE

BACKGROUND

The present invention relates to semiconductor device fabrication and integrated circuits and, more specifically, to semiconductor structures including electrical isolation and methods of forming a semiconductor structure including electrical isolation.

Device structures, such as radiofrequency switches, are susceptible to high capacitance and body-to-body leakage when formed using a bulk semiconductor wafer. A measure that may be taken to reduce the susceptibility is to replace the bulk wafer with a silicon-on-insulator wafer in which a buried insulator layer is arranged between the body furnishing an active region of the device structure and the body of the substrate beneath the buried insulator layer. Another measure that may be taken to reduce the susceptibility is to provide triple well isolation that surrounds the active region of the device structure.

Although such measures have proven suitable for their intended purpose, semiconductor structures with improved electrical isolation and methods of forming a semiconductor structure including electrical isolation are needed.

SUMMARY

In an embodiment of the invention, a structure includes a semiconductor substrate and a plurality of shallow trench isolation regions extending from a top surface of the semiconductor substrate into the semiconductor substrate. The semiconductor substrate contains single-crystal semiconductor material, and the shallow trench isolation regions are positioned to surround an active device region of the semiconductor substrate. The structure further includes a polycrystalline layer in the semiconductor substrate. The polycrystalline layer has a first section beneath the active device region and a second section beneath the plurality of shallow trench isolation regions. The first section of the polycrystalline layer is located at a different depth relative to the top surface of the semiconductor substrate than the second section of the polycrystalline layer.

In an embodiment of the invention, a method includes forming a plurality of shallow trench isolation regions that extend from a top surface of a semiconductor substrate into the semiconductor substrate and that surround an active device region of the semiconductor substrate. A single ion implantation is preformed into the semiconductor substrate that produces a band of implanted inert ions beneath the top surface of the semiconductor substrate and that damages single-crystal semiconductor material in an implanted region between the top surface of the semiconductor substrate and the band of implanted inert ions. The semiconductor substrate is recrystallized in the implanted region and the band of implanted inert ions with an annealing process to produce a polycrystalline layer in the semiconductor substrate. The band of implanted inert ions in the implanted region includes a first section beneath the active device region and a second section beneath the plurality of shallow trench isolation regions. The first section of the band of implanted inert ions extends to a different depth relative to the top surface of the semiconductor substrate than the second section of the band of implanted inert ions.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
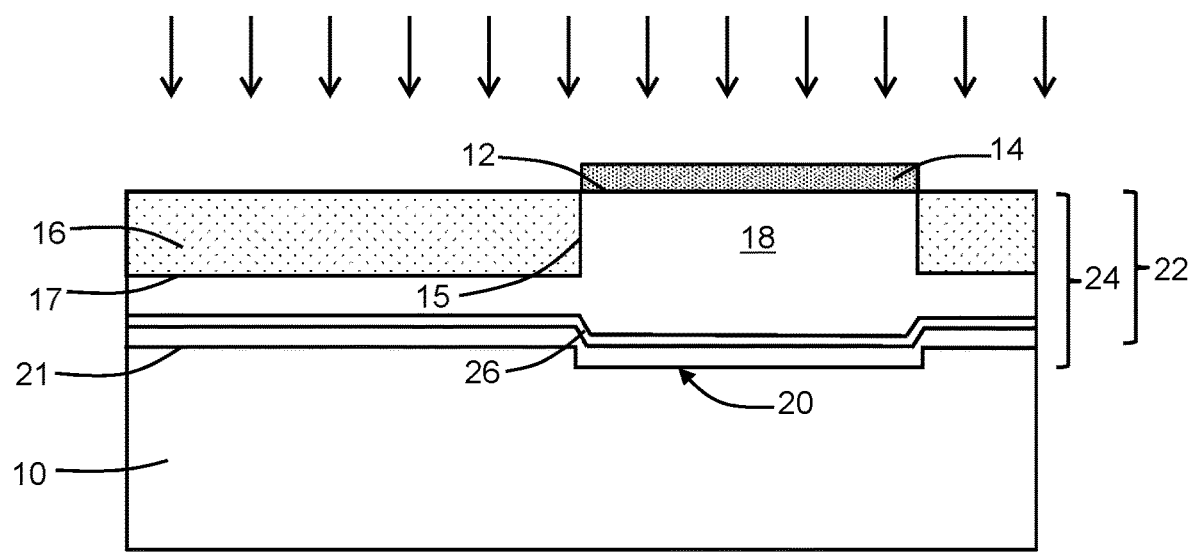
FIGS. 1-3 are cross-sectional views of a semiconductor structure at successive fabrication stages of a processing method in accordance with embodiments of the invention.

With reference to FIG. 1 and in accordance with embodiments of the invention, a semiconductor substrate 10 is provided that is composed of a monocrystalline or single-crystal semiconductor material, such as single-crystal silicon. The semiconductor substrate 10 may be a bulk wafer composed of single-crystal semiconductor material (e.g., single-crystal silicon), and the bulk wafer may be either a high-resistivity bulk wafer or a low-resistivity bulk wafer. Generally, a high-resistivity bulk wafer may contain silicon having a resistivity greater than 100 ohm-cm, and a low-resistivity bulk silicon wafer may contain silicon having a resistivity less than 100 ohm-cm. A dielectric layer 14 may be formed on a portion of a top surface 12 of the semiconductor substrate 10. The dielectric layer 14 may be composed of a dielectric material, such as silicon dioxide, deposited on the top surface 12 by chemical vapor deposition or grown from the top surface 12 by thermal oxidation, and then patterned with lithography and etching processes.

Shallow trench isolation regions 16 are formed that extend from the top surface 12 of the semiconductor substrate 10 to a shallow depth into the semiconductor substrate 10. The shallow trench isolation regions 16 may contain a dielectric material deposited by chemical vapor deposition into trenches etched in the semiconductor substrate 10 by a masked etching process that may use the dielectric layer 14 as a hardmask, polished, and deglazed. The dielectric material contained in the shallow trench isolation regions 16 may be silicon dioxide, silicon nitride, silicon carbide, silicon-rich silicon dioxide, or a combination of two or more of these materials. The depth of the shallow trench isolation regions 16 relative to the top surface 12 may range from 0.1 μm to 1.0 μm.

The shallow trench isolation regions 16 surround an active device region 18 of the semiconductor substrate 10 in which an active device or a passive device may be subsequently fabricated. The shallow trench isolation regions 16 have a side surface defining an interface 15 with the active device region 18, and a bottom surface defining an interface 17 with the underlying semiconductor substrate 10. The interface 15 may be oriented normal or substantially normal to the top surface 12 of the semiconductor substrate 10, the interface 17 may be oriented parallel or substantially parallel to the top surface 12, and the interfaces 15, 17 meet or converge at a lower corner of the shallow trench isolation regions 16.

An implanted region 20 of modified semiconductor material is formed by ion implantation in the semiconductor substrate 10. A band 26 including the atomic species constituting the stopped ions is defined within the implanted region 20. The implanted region 20 and band 26 include sections 22, 24 that extend over different depth ranges relative to the top surface 12 of the semiconductor substrate 10. The section 22 of the implanted region 20 and band 26 is located beneath the shallow trench isolation regions 16. The section 24 of the implanted region 20 includes the active device region 18, and the section 24 of the implanted region 20 and the band 26 are located where the shallow trench isolation regions 16 are absent. The section 22 of the implanted region 20 and band 26 surrounds the section 24 of the implanted region 20 and band 26. The sections 22, 24 of the implanted region 20 and the band 26 extend fully beneath the shallow trench isolation regions 16 and active device region 18, and are continuous. The sections 22, 24 of the implanted region 20 and band 26 converge in alignment with the interface 15 between the shallow trench isolation regions 16 and the active device region 18. The implanted region 20 includes a lower boundary 21 with the single-crystal semiconductor material of the semiconductor substrate 10 following implantation. The semiconductor substrate 10 may be undamaged and remain single crystal at depths located beyond the lower boundary 21 of the implanted region 20. The shallow trench isolation regions 16 are substantially unaffected by the implanted ions.

The implanted region 20 and band 26 are formed by a single implantation of ions. The ion implantation performed to form the implanted region 20 and band 26 introduces energetic ions, as indicated diagrammatically by the single-headed arrows, with ion trajectories that travel in paths through the semiconductor substrate 10 in the active device region 18, the dielectric material of the dielectric layer 14 over the active device region 18, and the dielectric material of the shallow trench isolation regions 16 surrounding the active device region 18 into the semiconductor substrate 10 beneath the shallow trench isolation regions 16 and active device region 18. The energetic ions lose energy along their paths via stochastic scattering events with atomic nuclei and electrons in the traversed materials. Energy lost in nuclear collisions, which dominates at low energies, displaces target atoms of the semiconductor substrate 10 from their original lattice sites, which damages the crystal lattice structure of the semiconductor substrate 10 and generates point defects. The ions eventually stop after the ion energy is fully dissipated by the energy loss. The crystal lattice structure of the semiconductor substrate 10 may be damaged within the implanted region 20, compared to the initial single-crystal state, by the damage induced by the implanted ions. The crystal lattice structure of the semiconductor substrate 10 may be amorphized over the depth range of the implanted region 20 relative to its initial single-crystal state by the damage induced by the implanted ions.

In the representative embodiment, the ions stop in the semiconductor material of the semiconductor substrate 10 to define the band 26 that includes the atomic species constituting the stopped ions. The distribution of implanted atoms in the band 26 may be approximated by a Gaussian shape centered about a projected range or, alternatively, may be approximated by a moments distribution characterized by a projected range, straggle, skewness, and kurtosis. The peak in the distribution of implanted atoms occurs at the projected range. The distribution of implantation damage in the implanted region 20 may exhibit a peak damage also occurring near the projected range of the ions.

The ions may be generated from a suitable source gas and implanted into the semiconductor substrate 10 with one or more implantation conditions using an ion implantation tool. The implantation conditions (e.g., ion species, dose, energy) may be selected to tune the characteristics (e.g., depth profile, amount of damage) of the implanted region 20. In an embodiment, the ions may be generated from argon, or from another type of noble atom gas or inert gas. The ion dose is selected to be less than a threshold dose beyond which recrystallization of the damaged semiconductor material in the implanted region 20 by a subsequent anneal is not possible. In an embodiment, the ion dose may be less than or equal to $1.3\times10^{15}$ ions/cm$^2$. In an embodiment, the ion dose may be greater than or equal to $1\times10^{14}$ ions/cm$^2$. In an embodiment, the ion dose may be within a range of $1\times10^{13}$ ions/cm$^2$ to $1\times10^{15}$ ions/cm$^2$.

The implanted region 20 and the band 26 within implanted region 20 exhibit a depth profile in the section 22 of implanted region 20, a different depth profile in the section 24 of implanted region 20, and stepped transitions between the different depth profiles at the outer perimeter of the active device region 18 (i.e., the inner perimeter of the shallow trench isolation regions 16). The differences in the depth profiles over respective depth ranges between the top surface 12 and the lower boundary 21 arise from differences in the stopping powers of the materials traversed by the ions in the section 22 and the stopping powers of the materials traversed by the ions in the section 24. The material of the semiconductor substrate 10 is characterized by a different stopping power than the material of the shallow trench isolation regions 16. The stopping power may be defined as the energy loss per unit length of the ion path in which the energy loss may include contributions from coulombic scattering events with atomic nuclei and interactions with the electrons in the traversed materials.

The ions producing the section 22 of the implanted region 20 and band 26 pass through the shallow trench isolation regions 16 and the semiconductor material of the semiconductor substrate 10 beneath the shallow trench isolation regions 16 before stopping in the section 22 of the band 26 beneath the shallow trench isolation regions 16. The ions producing the section 24 of the implanted region 20 and band 26 pass through the section of the dielectric layer 14 over the active device region 18 and the semiconductor material of the semiconductor substrate 10 before stopping in the section 24 of the band 26 beneath the active device region 18. In the representative embodiment, the stopping power of the shallow trench isolation regions 16 is greater than a composite (i.e., added) stopping power of the dielectric layer 14 and the active device region 18 of the semiconductor substrate 10. The result is that the ions penetrate to a greater depth in the section 24 of the implanted region 20 such that the section 24 of the implanted region 20 and the band 26 within the section 24 of implanted region 20 are located at a greater depth in the semiconductor substrate 10 than the section 22 of the implanted region 20 and the band 26 within the section 22 of implanted region 20.

In an alternative embodiment, an optional hardmask layer (not shown) may be formed over the shallow trench isolation regions 16 and used to effectively increase the stopping power associated with the shallow trench isolation regions 16. In an alternative embodiment, the thickness and/or composition of the dielectric layer 14 may be modified to effectively decrease or increase the stopping power associated with the active device region 18.

Figure 2:
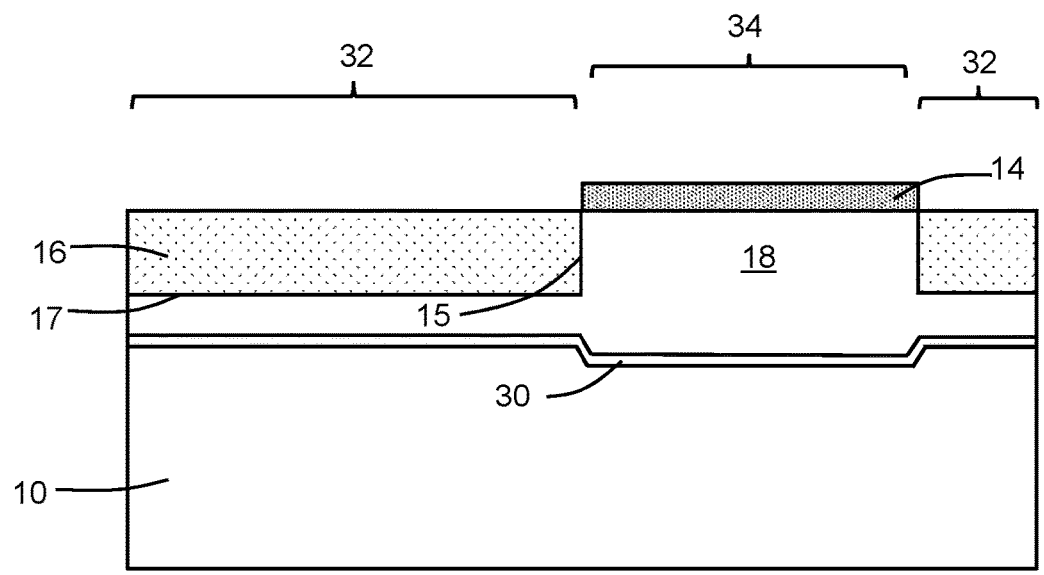

With reference to FIG. 2 in which like reference numerals refer to like features in FIG. 1 and at a subsequent fabrication stage of the processing method, the semiconductor substrate 10 is subjected to a thermal treatment (i.e., annealing process), which subjects the implanted region 20 of the semiconductor substrate 10 to the thermal treatment. In an embodiment, the thermal treatment used to thermally treat the implanted region 20 of the semiconductor substrate 10 may be a spike anneal. In an embodiment, the spike anneal may be a rapid thermal anneal (RTA) performed using, for example, a bank of flash lamps that heat the semiconductor substrate 10 to a peak temperature in a range of 860° C. to 1125° C. with a dwell time at the peak temperature of 34 milliseconds to 60 seconds and, in a particular embodiment, the peak temperature may be 1000° C. held for a dwell time of 5 seconds.

The thermal treatment recrystallizes a portion of the damaged semiconductor material of the implanted region 20 into a polycrystalline layer 30 that contains polycrystalline semiconductor material (e.g., polysilicon), gas atoms, and defects as residual damage in addition to the grains of the polycrystalline semiconductor material. The single-crystal semiconductor material of the semiconductor substrate 10, which is arranged below the implanted region 20, provides a crystalline template for recrystallization. The polycrystalline layer 30 may be arranged substantially at or near the former location of the band 26 containing the peak ion dose and/or peak damage in the semiconductor material of the semiconductor substrate 10. The defects may contain trapped atoms of the noble gas or inert gas species (e.g., argon) from the band 26. The polycrystalline layer 30 may be lightly doped similar to the original doping of the semiconductor substrate 10 and may have a high resistance relative to the remainder of the semiconductor substrate 10.

The thermal treatment also recrystallizes the damaged semiconductor material of the implanted region 20 surrounding the band 26 into monocrystalline or single-crystal semiconductor material (e.g., single-crystal silicon). The single-crystal semiconductor material of the implanted region 20 is located primarily between the polycrystalline layer 30 and the top surface 12 of the semiconductor substrate 10. The recrystallized semiconductor material of the implanted region 20 lacks inert gas atoms, grains, and defects in contrast to the polycrystalline layer 30.

The polycrystalline layer 30 includes sections 32, 34 that extend over different depth ranges relative to the top surface 12 of the semiconductor substrate 10, and that are respectively established by recrystallization within and near the band 26 in the different sections 22, 24 of the implanted region 20. The section 32 of the polycrystalline layer 30 is located substantially at the former locations of the section 22 of the band 26 of implanted ions, and the section 34 of the polycrystalline layer 30 is located substantially at the former locations of the section 24 of the band 26 of implanted ions. The section 34 of the polycrystalline layer 30 is arranged beneath the active device region 18 and is located where the shallow trench isolation regions 16 are absent. The section 32 of the polycrystalline layer 30 is located beneath the shallow trench isolation regions 16. The section 32 of the polycrystalline layer 30 surrounds the section 34 of the polycrystalline layer 30. The sections 32, 34 of the polycrystalline layer 30 converge in alignment with the interface 15 between the shallow trench isolation regions 16 and the active device region 18, and the sections 32, 34 of the polycrystalline layer 30 are continuous.

In embodiments, the section 32 of the polycrystalline layer 30 may be located on a different plane to the top surface 12 of the semiconductor substrate 10 than the section 34 of the polycrystalline layer 30. In the representative embodiment, the section 32 of the polycrystalline layer 30 is located in a plane that is closer to the top surface 12 of the semiconductor substrate 10 than a plane containing the section 34 of the polycrystalline layer 30. In an embodiment, the section 32 of the polycrystalline layer 30 may be formed coextensive with the bottom of the shallow trench isolation regions 16 by adjusting the implantation energy such that the band 26 in the section 22 of the implanted region 20 is substantially coextensive with the bottom of the shallow trench isolation regions 16.

In the representative embodiment, the section 32 of the polycrystalline layer 30 has the same thickness as the section 34 of the polycrystalline layer 30. In an embodiment, the section 32 of the polycrystalline layer 30 may be greater than the thickness of the section 34 of the polycrystalline layer 30. In an embodiment, the section 32 of the polycrystalline layer 30 may be less than the thickness of the section 34 of the polycrystalline layer 30.

Figure 3:
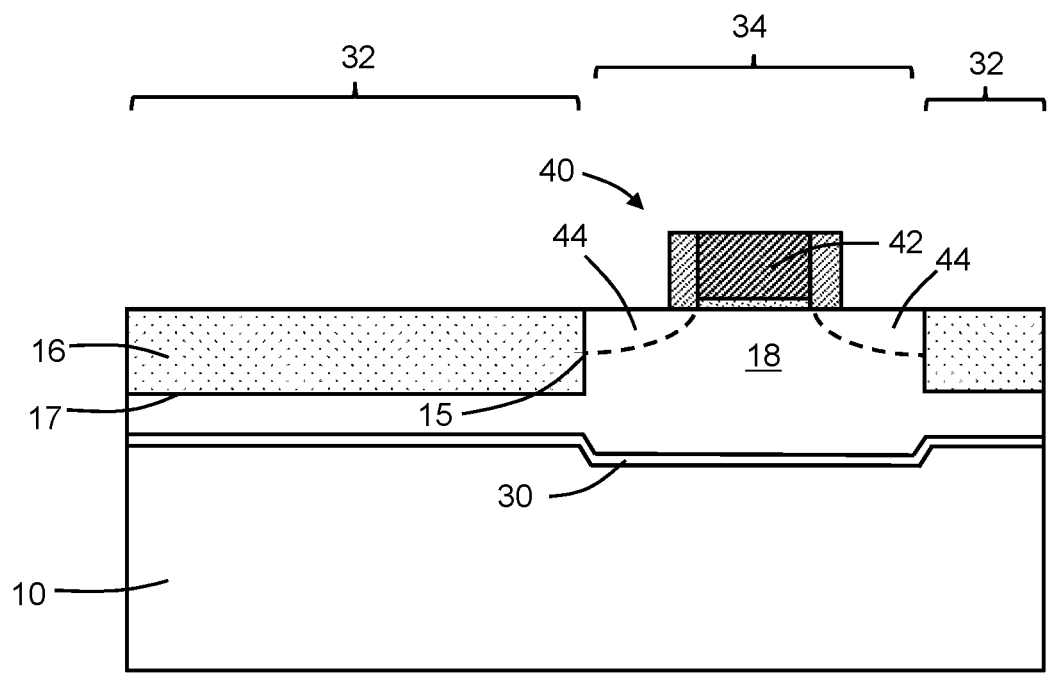

With reference to FIG. 3 in which like reference numerals refer to like features in FIG. 2 and at a subsequent fabrication stage of the processing method, a field-effect transistor 40 may be fabricated by front-end-of-line (FEOL) processing as a device structure in the active device region 18 of the semiconductor substrate 10. The field-effect transistor 40 may include a gate electrode 42 and a gate dielectric formed by depositing a layer stack and patterning the layer stack with photolithography and etching processes. The gate electrode 42 may be composed of a conductor, such as doped polycrystalline silicon (i.e., polysilicon) or a work function metal, and the gate dielectric may be composed of an electrical insulator, such as silicon dioxide or hafnium oxide. The field-effect transistor 40 may include other elements such as halo regions, lightly doped drain extensions, source/drain regions 44 in the well, and sidewall spacers on the gate electrode 42.

In an embodiment, the field-effect transistor 40 may provide a switch field-effect transistor in a radio-frequency circuit. In alternative embodiments, a different type of active or passive device structure may be formed in the active device region 18 instead of the field-effect transistor 40.

The polycrystalline layer 30 may improve device performance by acting as an isolation layer between the field-effect transistor 40 and the bulk substrate portion of the semiconductor substrate 10 beneath the polycrystalline layer 30. For example, the field-effect transistor 40 may be used in, for example, a switch or a low-noise amplifier, which have a performance that benefits from the electrical isolation provided by the polycrystalline layer 30. In addition, the polycrystalline layer 30 effectively increases the substrate resistance and, for that reason, reduces the sub-channel leakage to the bulk substrate portion of the semiconductor substrate 10 beneath the polycrystalline layer 30.

Figure 4:
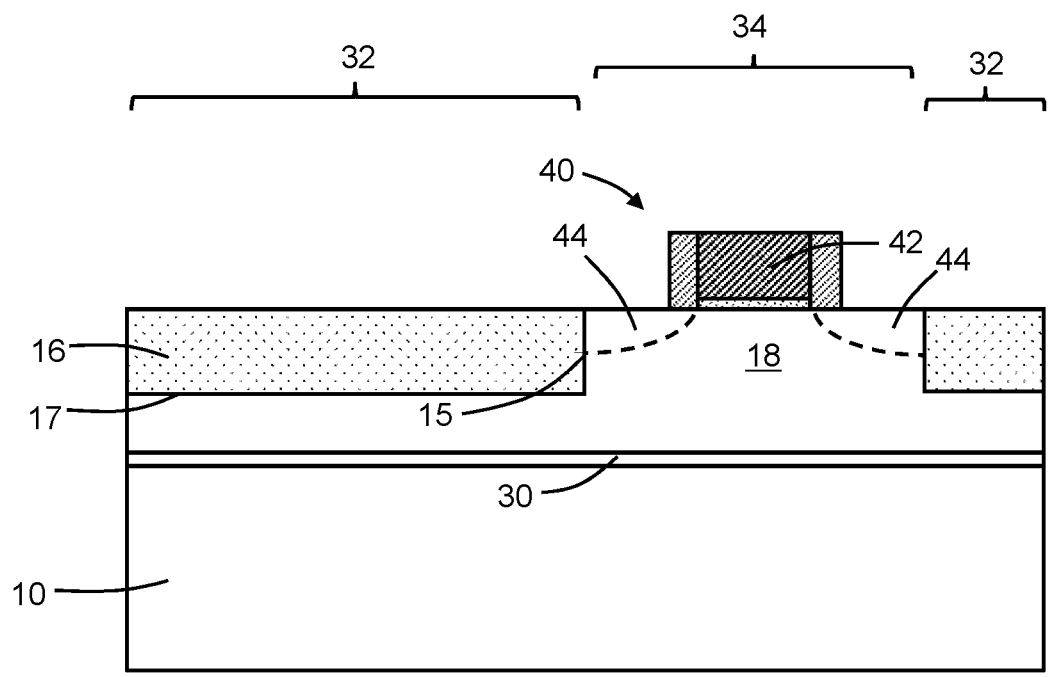
FIGS. 4-8 are cross-sectional views of semiconductor structures in accordance with alternative embodiments of the invention.
Figure 5:
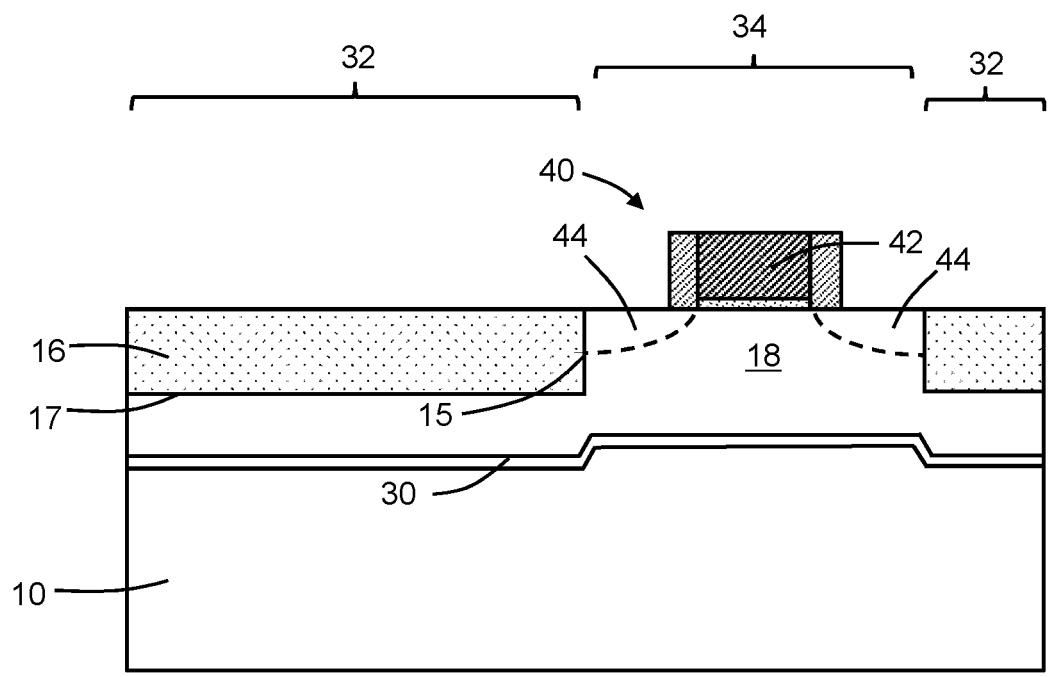
Figure 6:
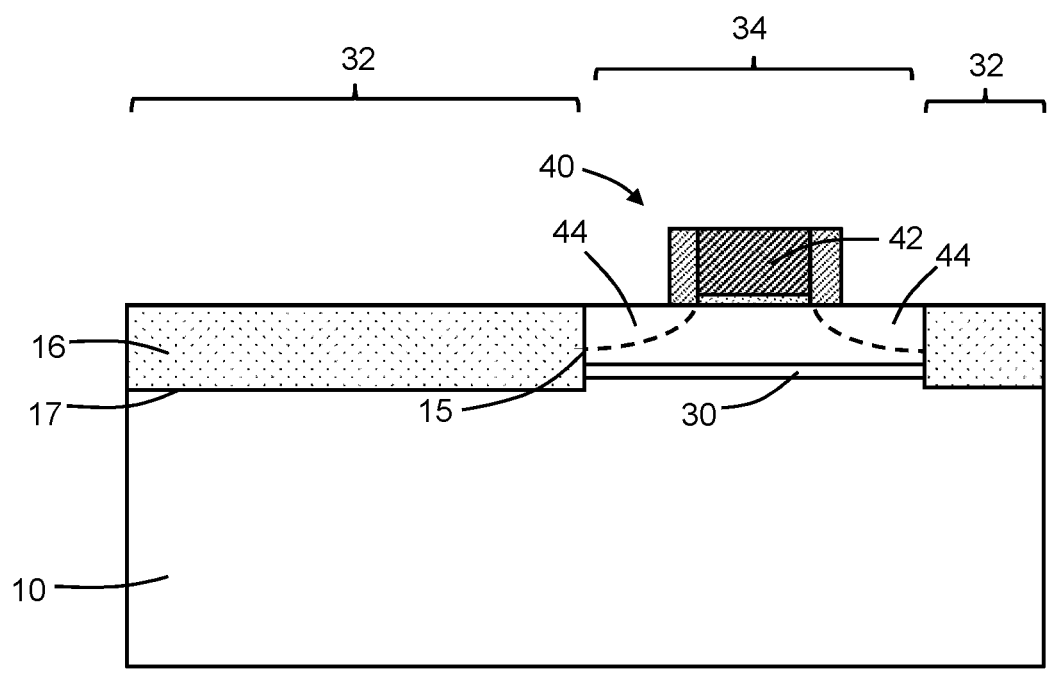

With reference to FIGS. 4-6 in which like reference numerals refer to like features in FIG. 3 and in accordance with alternative embodiments of the invention, the arrangement of the sections 32, 34 of the polycrystalline layer 30 may be modified by modifying the arrangement of the sections 22, 24 of the implanted region 20 and the band 26 within the different sections 22, 24 through adjustment of the implantation parameters. Among the parameters are the implantation energy, the stopping power of the shallow trench isolation regions 16, the stopping power the active device region 18 of the semiconductor substrate 10, and the stopping power of the dielectric layer 14. The stopping power of the shallow trench isolation regions 16 may be adjusted through a selection of their constituent material(s) and a selection of the depth over which they extend relative to the top surface 12 of the semiconductor substrate 10. The dielectric layer 14 may be removed from the active device region 18 to decrease the effective stopping power of the semiconductor substrate 10 in the active device region 18.

In an embodiment shown in FIG. 4, the stopping power of the shallow trench isolation regions 16 may be adjusted to be equal to the composite stopping power of the dielectric layer 14 and the active device region 18 of the semiconductor substrate 10. The sections 32, 34 of the polycrystalline layer 30 are located in the same plane and are located at the same depth relative to the top surface 12 of the semiconductor substrate 10 because the sections 22, 24 of the implanted region 20 and band 26 are substantially coplanar when formed by the implantation.

In an embodiment shown in FIG. 5, the stopping power of the shallow trench isolation regions 16 may be adjusted to be less than the composite stopping power of the dielectric layer 14 and the active device region 18 of the semiconductor substrate 10. The section 32 of the polycrystalline layer 30 is located in a plane that is positioned at a greater depth relative to the top surface 12 of the semiconductor substrate 10 than a plane containing the section 34 of the polycrystalline layer 30 because the section 22 of the implanted region 20 and band 26 are at greater depths than the section 24 of the implanted region 20 and band 26 when formed by the implantation.

In an embodiment shown in FIG. 6, the implantation energy may be adjusted such that the ions stop within the shallow trench isolation regions 16 and within the active device region 18. The section 32 of the polycrystalline layer 30 is not formed because the semiconductor substrate 10 beneath the shallow trench isolation regions 16 is not implanted to form the section 22 of the implanted region 20. Instead, the implanted ions stop within the bulk of the shallow trench isolation regions 16 such that this section 22 of the band 26 is within the shallow trench isolation regions 16.

Figure 7:
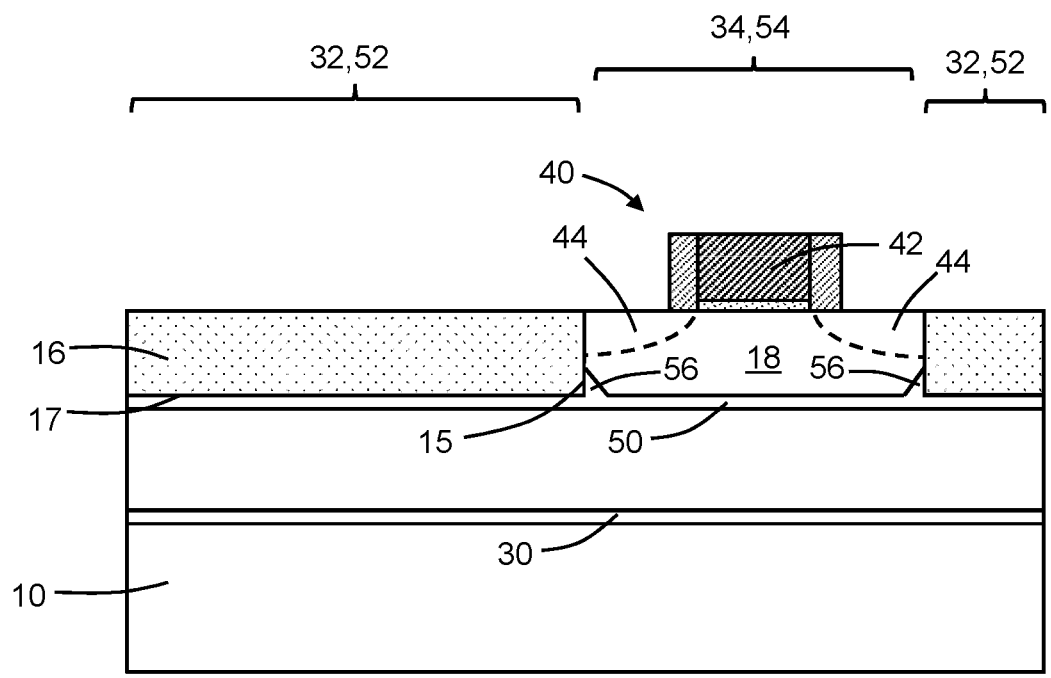

With reference to FIG. 7 in which like reference numerals refer to like features in FIG. 3 and in accordance with alternative embodiments of the invention, the sections 22, 24 of the implanted region 20 and band 26, which is formed by a single implantation, may recrystallize to form the polycrystalline layer 30 with the different sections 32, 34 and also form an additional polycrystalline layer 50 also with different sections 52, 54. The polycrystalline layers 30, 50 may have a stacked arrangement with the section 52 of the polycrystalline layer 50 positioned in a vertical direction between the section 32 of the polycrystalline layer 30 and the shallow trench isolation regions 16, and the section 54 of the polycrystalline layer 50 positioned in the vertical direction between the section 34 of the polycrystalline layer 30 and the active device region 18. The single-crystal semiconductor material of the semiconductor substrate 10 is arranged between the polycrystalline layers 30, 50. The polycrystalline layer 50 may share a boundary with the shallow trench isolation regions 16 across the interface 17. While the polycrystalline layer 30 is illustrated for a single implantation with equal stopping powers, the polycrystalline layer 30 may be formed for an instance in which the stopping powers are unequal as previously discussed.

The formation of multiple polycrystalline layers 30, 50 by the single implantation may depend upon various factors, such as the implantation energy and the implantation dose. The polycrystalline layers 30, 50 are separated in the vertical direction by recrystallized single-crystal semiconductor material. The polycrystalline layer 30 may be formed using a higher implantation energy and a higher dose than in embodiments in which the polycrystalline layer 50 is present. In embodiments, the formation of multiple polycrystalline layers 30, 50 may result from a single implantation having a dose greater than or equal to $1\times10^{14}$ ions/cm$^2$ and having an energy that places the projected range of the single implantation at a distance greater than or equal to 1000 nm from the interface 17 between the shallow trench isolation regions 16 and the semiconductor substrate 10.

In addition, regions 56 of polycrystalline semiconductor material may be located proximate to the lower corner of the shallow trench isolation regions 16 adjacent to the active device region 18 and are coupled to the section 54 of the polycrystalline layer 50. The regions 56 may be inclined or angled relative to the interface 15 between the shallow trench isolation regions 16 and the active device region 18, and the regions 56 may have a width that decreases with increasing distance from the polycrystalline layer 50. The regions 56 may extend laterally and vertically from a lower corner of the shallow trench isolation regions 16 up the interface 15 and into a portion of the active device region 18 such that the regions 56 are positioned at least in part in the active device region 18. The regions 56 may be angled at an acute angle relative to the interface 15. The regions 56 may extend about the full perimeter of the active device region 18, and the regions 56 are located above the section 54 of the polycrystalline layer 50.

Figure 8:
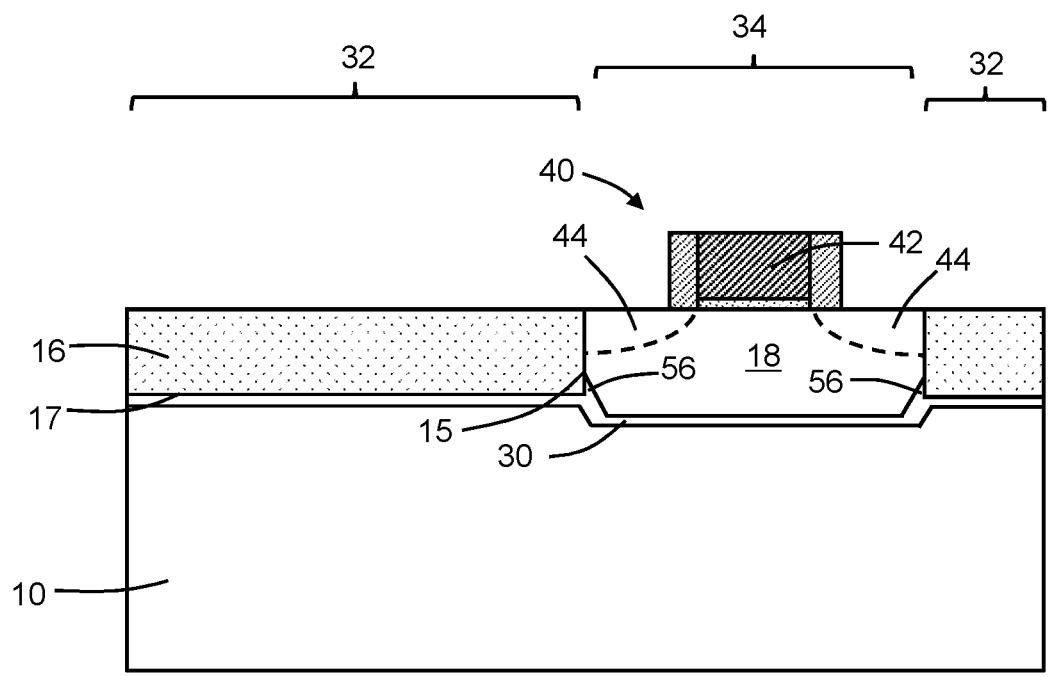

In embodiments in which only polycrystalline layer 30 is formed as previously described, the regions 56 of polycrystalline semiconductor material may be formed in association with the formation of the polycrystalline layer 30. As shown in FIG. 8, the regions 56 may be coupled to the polycrystalline layer 30 and may be located proximate to the corner of the shallow trench isolation regions 16 while projecting into the active device region 18.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate including a top surface, the semiconductor substrate containing single-crystal semiconductor material;
   a plurality of shallow trench isolation regions extending from the top surface of the semiconductor substrate into the semiconductor substrate, the plurality of shallow trench isolation regions positioned to surround an active device region of the semiconductor substrate; and
   a first polycrystalline layer in the semiconductor substrate, the first polycrystalline layer including a first section beneath the active device region and a second section beneath the plurality of shallow trench isolation regions, and the first section of the first polycrystalline layer located at a different depth relative to the top surface of the semiconductor substrate than the second section of the first polycrystalline layer.

2. The structure of claim 1 wherein the first section of the first polycrystalline layer is located in a first plane at a first depth relative to the top surface of the semiconductor substrate, the second section of the first polycrystalline layer is located in a second plane at a second depth relative to the top surface of the semiconductor substrate, and the second depth is greater than the first depth.

3. The structure of claim 1 wherein the first section of the first polycrystalline layer is located in a first plane at a first depth relative to the top surface of the semiconductor substrate, the second section of the first polycrystalline layer is located in a second plane at a second depth relative to the top surface of the semiconductor substrate, and the second depth is less than the first depth.

4. The structure of claim 1 wherein the first section and the second section of the first polycrystalline layer are continuous.

5. The structure of claim 1 further comprising:
   a second polycrystalline layer in the semiconductor substrate, the second polycrystalline layer including a first section beneath the active device region and a second section beneath the plurality of shallow trench isolation regions.

6. The structure of claim 5 wherein the first section of the second polycrystalline layer is positioned between the first section of the first polycrystalline layer and the active device region, and the second section of the second polycrystalline layer is positioned between the second section of the first polycrystalline layer and the plurality of shallow trench isolation regions.

7. The structure of claim 5 wherein the plurality of shallow trench isolation regions have a first interface with a portion of the semiconductor substrate beneath the plurality of shallow trench isolation regions, and the second section of the second polycrystalline layer contacts the plurality of shallow trench isolation regions at the first interface.

8. The structure of claim 5 wherein the plurality of shallow trench isolation regions have a first interface with a portion of the semiconductor substrate beneath the plurality of shallow trench isolation regions and a second interface with the active device region, the first interface and the second interface converge at a corner, and further comprising:
   a region of polycrystalline semiconductor material arranged proximate to the corner between the first interface and the second interface, the region of polycrystalline semiconductor material coupled to the second polycrystalline layer and extending toward the top surface of the semiconductor substrate.

9. The structure of claim 1 further comprising:
   a field-effect transistor including a gate structure arranged over the active device region and a source/drain region arranged in the active device region.

10. The structure of claim 1 wherein the plurality of shallow trench isolation regions have a first interface with a portion of the semiconductor substrate beneath the plurality of shallow trench isolation regions and a second interface with the active device region, the first interface and the second interface converge at a corner, and the first section and the second section of the first polycrystalline layer converge in alignment with the second interface.

11. The structure of claim 10 further comprising:
   a region of polycrystalline semiconductor material arranged proximate to the corner between the first interface and the second interface, the region of polycrystalline semiconductor material positioned between the first interface and the top surface of the semiconductor substrate.

12. The structure of claim 11 wherein the region of polycrystalline semiconductor material is angled at an acute angle relative to the second interface.

13. The structure of claim 12 wherein the region of polycrystalline semiconductor material is positioned in the active device region.

14. A method comprising:
   forming a plurality of shallow trench isolation regions that extend from a top surface of a semiconductor substrate into the semiconductor substrate and that surround an active device region of the semiconductor substrate;
   performing a single ion implantation into the semiconductor substrate that produces a band of implanted inert ions beneath the top surface of the semiconductor substrate and that damages single-crystal semiconductor material in an implanted region between the top surface of the semiconductor substrate and the band of implanted inert ions; and
   recrystallizing the semiconductor substrate in the implanted region and the band of implanted inert ions with an annealing process to produce a first polycrystalline layer in the semiconductor substrate,
   wherein the band of implanted inert ions in the implanted region includes a first section beneath the active device region and a second section beneath the plurality of shallow trench isolation regions, and the first section of the band of implanted inert ions extends to a different depth relative to the top surface of the semiconductor substrate than the second section of the band of implanted inert ions.

15. The method of claim 14 wherein the first section of the band of implanted inert ions is located in a first plane at a first depth relative to the top surface of the semiconductor substrate, the second section of the band of implanted inert ions is located in a second plane at a second depth relative to the top surface of the semiconductor substrate, and the second depth is greater than the first depth.

16. The method of claim 14 wherein the first section of the band of implanted inert ions is located in a first plane at a first depth relative to the top surface of the semiconductor substrate, the second section of the band of implanted inert ions is located in a second plane at a second depth relative to the top surface of the semiconductor substrate, and the second depth is less than the first depth.

17. The method of claim 14 wherein the annealing process produces a second polycrystalline layer in the semiconductor substrate, and the second polycrystalline layer includes a first section beneath the active device region and a second section beneath the plurality of shallow trench isolation regions.

18. The method of claim 17 wherein the first polycrystalline layer includes a first section beneath the active device region substantially at a former location of the first section of the band of implanted inert ions and a second section beneath the plurality of shallow trench isolation regions substantially at a former location of the second section of the band of implanted inert ions, the first section of the second polycrystalline layer is positioned between the first section of the first polycrystalline layer and the active device region, and the second section of the second polycrystalline layer is positioned between the second section of the first polycrystalline layer and the plurality of shallow trench isolation regions.

19. The method of claim 17 wherein the plurality of shallow trench isolation regions have a first interface with a portion of the semiconductor substrate beneath the plurality of shallow trench isolation regions and a second interface with the active device region, the first interface and the second interface converge at a corner, the annealing process forms a section of polycrystalline semiconductor material arranged at the corner between the first interface and the second interface, and the section of polycrystalline semiconductor material is positioned between the first interface and the top surface of the semiconductor substrate.

20. The method of claim 14 wherein the first polycrystalline layer includes a first section beneath the active device region substantially at a former location of the first section of the band of implanted inert ions and a second section beneath the plurality of shallow trench isolation regions substantially at a former location of the second section of the band of implanted inert ions, and the semiconductor substrate includes recrystallized single-crystal semiconductor material between the first polycrystalline layer and the top surface of the semiconductor substrate following the annealing process.

* * * * *